United States Patent
Kim

(10) Patent No.: US 10,269,871 B2
(45) Date of Patent: Apr. 23, 2019

(54) ORGANIC LIGHT EMITTING DEVICE AND ORGANIC LIGHT EMITTING DISPLAY DEVICE USING THE SAME

(71) Applicant: LG DISPLAY CO., LTD., Seoul (KR)

(72) Inventor: Mi-Na Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/857,237

(22) Filed: Dec. 28, 2017

(65) Prior Publication Data

US 2018/0190726 A1   Jul. 5, 2018

(30) Foreign Application Priority Data

Dec. 30, 2016  (KR) ........................ 10-2016-0183919

(51) Int. Cl.
H01L 27/32      (2006.01)
H01L 51/52      (2006.01)
H01L 51/50      (2006.01)

(52) U.S. Cl.
CPC ........ *H01L 27/3209* (2013.01); *H01L 51/504* (2013.01); *H01L 51/5206* (2013.01); *H01L 51/5221* (2013.01); *H01L 27/3211* (2013.01)

(58) Field of Classification Search
CPC .............. H01L 27/3209; H01L 51/504; H01L 51/5221; H01L 51/5206; H01L 27/3211
See application file for complete search history.

(56) References Cited

U.S. PATENT DOCUMENTS 9,105,857 B2 *   8/2015   Kubota ............... H01L 51/5044
2013/0277654 A1 * 10/2013  Seo .................... H01L 51/5262
                                                          257/40

* cited by examiner

*Primary Examiner* — Thanh Y. Tran
(74) *Attorney, Agent, or Firm* — Birch, Stewart, Kolash & Birch, LLP

(57) ABSTRACT

An organic light emitting device and an organic light emitting display device using the same are discussed, for changing a structure of an emissive layer to enhance viewing angle characteristics and lifespan. Emissive layers having hosts with different characteristics are stacked to prevent visual reduction depending on a viewing angle and to enhance a lifespan.

11 Claims, 8 Drawing Sheets

ORGANIC LIGHT EMITTING DEVICE AND ORGANIC LIGHT EMITTING DISPLAY DEVICE USING THE SAME

CROSS-REFERENCE TO RELATED APPLICATION

This application claims the benefit of Korean Patent Application No. 10-2016-0183919, filed on Dec. 30, 2016 in the Republic of Korea, the disclosures of all of which are incorporated herein by reference in their entirety.

BACKGROUND OF THE INVENTION

Field of the Invention

The present invention relates to an organic light emitting device, and more particularly, to an organic light emitting device and an organic light emitting display device using the same, for changing a structure of an emissive layer to enhance viewing angle characteristics and a lifespan.

Discussion of the Related Art

Recently, as the information age has fully arrived, the field of displays that visually display electrically conveyed information signals has developed rapidly. In response to this, various kinds of flat panel display devices having excellent characteristics, such as a small thickness, a low weight, and low power consumption, have been developed and have rapidly replaced existing cathode ray tubes (CRTs).

Representative examples of such flat panel display devices may include a liquid crystal display (LCD) device, a plasma display panel (PDP) device, a field emission display (FED) device, and an organic light-emitting display (OLED) device.

Among these, the organic light-emitting display device is considered to have a competitive application because it does not require a separate light source and enables realization of a compact device design and vivid color display.

The organic light-emitting display device includes organic light-emitting elements, which are independently driven on a per-sub-pixel basis. Such an organic light-emitting element includes an anode, a cathode, and a plurality of organic layers between the anode and the cathode.

The organic layers include a hole injection layer, a hole transport layer, an organic light-emitting layer, and an electron transport layer, which are sequentially disposed from the anode. Among these, the organic light-emitting layer substantially functions to emit light as the energy of excitons, produced via the combination of holes and electrons, falls down to the ground state. The other layers function to assist in the transport of holes or electrons to the organic light-emitting layer.

An organic emissive layer includes hosts and dopants and emits light in a corresponding wavelength in which dopants operate. However, there is a problem in that a generally known organic light emitting device differently recognizes color depending on an angle at which a viewer sees and a lifespan of a material with excellent viewing angle characteristics is degraded and, accordingly, research has been conducted into an organic light emitting device with the enhanced viewing angle characteristics and lifespan.

SUMMARY OF THE INVENTION

Accordingly, the present invention is directed to an organic light emitting device and an organic light emitting display device using the same that substantially obviates one or more problems due to limitations and disadvantages of the related art.

An object of the present invention is to provide an organic light emitting device and an organic light emitting display device using the same, for changing a structure of an emissive layer to enhance viewing angle characteristics and a lifespan.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting device may be formed by layering emissive layers by using hosts with different photoluminescence (PL) characteristics to enhance both viewing angle characteristics and a lifespan.

For example, in an aspect of the present invention, an organic light emitting device includes first and second electrodes facing each other, and an organic light emitting device a light emitting portion comprising first and second emissive layers that contact each other in a thickness direction between the first and second electrodes. Here, the first emissive layer includes a first host of photoluminescence (PL) spectrum having a peak in a first wavelength, and the second emissive layer includes a second host of PL spectrum having a peak in a second wavelength spaced apart from the first wavelength by 15 nm to 123 nm.

The first and second emissive layers may further include dopants of a PL spectrum having a peak in the same wavelength.

The dopants of the first and second emissive layers may be the same and have PL spectrums with a peak in a wavelength of 610 nm to 630 nm.

PL spectrums of the first host and the second host may have an overlapping region with the PL spectrum of the dopant, and an overlapping region between the PL spectrum of the first host and the PL spectrum of the dopant may be greater than an overlapping region between the PL spectrum of the second host and the PL spectrum of the dopant.

The first wavelength may be 495 nm to 500 nm; and the second wavelength may be spaced apart from the first wavelength in the left direction by 15 nm to 30 nm.

A full width of half maximum (FWHM) of the PL spectrum of the first host may be 100 nm to 130 nm, and a full width of half maximum (FWHM) of the second host may be ½ or less of the FWHM of the first host.

An EL peak of the second emissive layer may be on the right side of an electroluminescence (EL) peak of the first emissive layer.

A thickness ratio of the first and second emissive layers may be 1:0.5 to 1:2.

In another aspect of the present invention, an organic light emitting display device includes a substrate comprising a plurality of sub pixels, thin film transistors disposed in the respective sub pixels, and the aforementioned organic light emitting device connected to the thin film transistor in at least one of the sub pixels.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
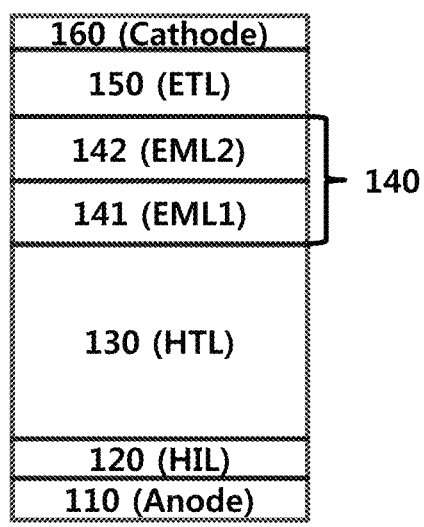
FIG. 1 is a cross-sectional view of an organic light emitting device according to an embodiment of the present invention.

The advantages and features of the embodiments of the present invention and the way of attaining them will become apparent with reference to embodiments described below in detail in conjunction with the accompanying drawings. The present invention, however, are not limited to the embodiments disclosed hereinafter and may be embodied in many different forms. Rather, these exemplary embodiments are provided so that this disclosure will be through and complete and will fully convey the scope to those skilled in the art. The scope of the present invention should be defined by the claims.

In the drawings for explaining the exemplary embodiments of the present invention, for example, the illustrated shape, size, ratio, angle, and number are given by way of example, and thus, are not limited to the disclosure of the present invention. Throughout the present specification, the same reference numerals designate the same constituent elements. In addition, in the following description of the present invention, a detailed description of known functions and configurations incorporated herein will be omitted when it may make the subject matter of the present invention rather unclear. The terms "comprises," "includes," and/or "has", used in this specification, do not preclude the presence or addition of other elements unless it is used along with the term "only". The singular forms are intended to include the plural forms as well, unless the context clearly indicates otherwise.

In the interpretation of constituent elements included in the various embodiments of the present invention, the constituent elements are interpreted as including an error range even if there is no explicit description thereof.

In the description of the various embodiments of the present invention, when describing positional relationships, for example, when the positional relationship between two parts is described using "on", "above", "below", "aside", or the like, one or more other parts may be located between the two parts unless the term "directly" or "closely" is used.

In the description of the various embodiments of the present invention, when describing temporal relationships, for example, when the temporal relationship between two actions is described using "after", "subsequently", "next", "before", or the like, the actions may not occur in succession unless the term "directly" or "just" is used.

In the description of the various embodiments of the present invention, although terms such as, for example, "first" and "second" may be used to describe various elements, these terms are merely used to distinguish the same or similar elements from each other. Therefore, in the present specification, an element modified by "first" may be the same as an element modified by "second" within the technical scope of the present invention unless otherwise mentioned.

The respective features of the various embodiments of the present invention may be partially or wholly coupled to and combined with each other, and various technical linkage and driving thereof are possible. These various embodiments may be performed independently of each other, or may be performed in association with each other.

In the specification, the 'lowest unoccupied molecular orbitals level (LUMO) energy level' and 'highest occupied molecular orbitals level (HOMO) energy level' of a layer refers to a LUMO energy level and HOMO energy level of a material that occupies the most weight ratio, e.g., a host material of a corresponding layer as long as not being referred to as a LUMO energy level and HOMO energy level of a dopant material doped on the corresponding layer.

In the specification, the 'HOMO energy level' may be an energy level measured via a cyclic voltammetry (CV) method for determining an energy level from a relative potential voltage with respect to a reference electrode with a known electrode potential value. For example, a HOMO energy level of a material may be measured using Ferrocene with known oxidation and reduction potential values as a reference electrode.

In the specification, the 'doped' refers to the case in which a material with different material properties (which correspond to, for example, N-type and P-type materials or organic and inorganic materials) from a material that occupies the most weight ratio of a layer is added with a weight ratio less than 10% to the material that occupies the most weight ratio of the layer. In other words, the 'doped' layer refers to a layer that is capable of being distinguished in consideration of a weight ratio of a host material and a dopant material of a layer. In addition, the 'non-doped' refers to any case other than the case corresponding to the 'doped'. For example, when a layer includes a single material or mixed materials with the same or similar properties, the layer is included in the 'non-doped' layer. For example, when at least one of materials included in a layer is a P-type and all materials included in the layer are not an N-type, the layer is included in the 'non-doped' layer. For example, when at least one of materials included in a layer is an organic material and all materials included in the layer are not an inorganic material, the layer is included in the 'non-doped' layer. For example, when all materials included in a layer are an organic material and at least one of materials included in the layer is an N-type and another at least one is a P-type, if an N-type material has a weight ratio less than 10% or a P-type material has a weight ratio less than 10%, the layer is included in the 'doped' layer.

In the specification, an electroluminescence (EL) spectrum is calculated via product of (1) a photoluminescence (PL) spectrum that represents unique properties of a photoluminescence material such as a dopant or host material included in an organic emissive layer and (2) outcoupling emittance spectrum curves determined depending on the optical properties and structure of an organic light emitting device including thicknesses of organic layers such as an electron transfer layer.

Figure 2:
FIG. 2 is a schematic diagram illustrating structures of first and second emissive layers of FIG. 1.
Figure 2:
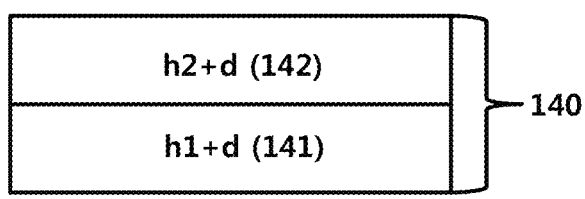
Figure 2:
Figure 3:
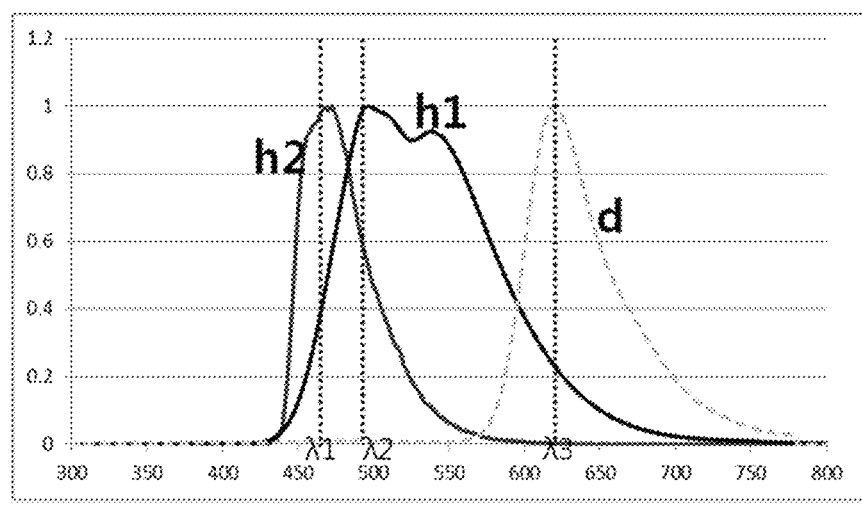
FIG. 3 is a graph showing PL spectrum of a dopant and first and second hosts used in first and second emissive layers in an organic light emitting device according to an example of the present invention.
Figure 4:
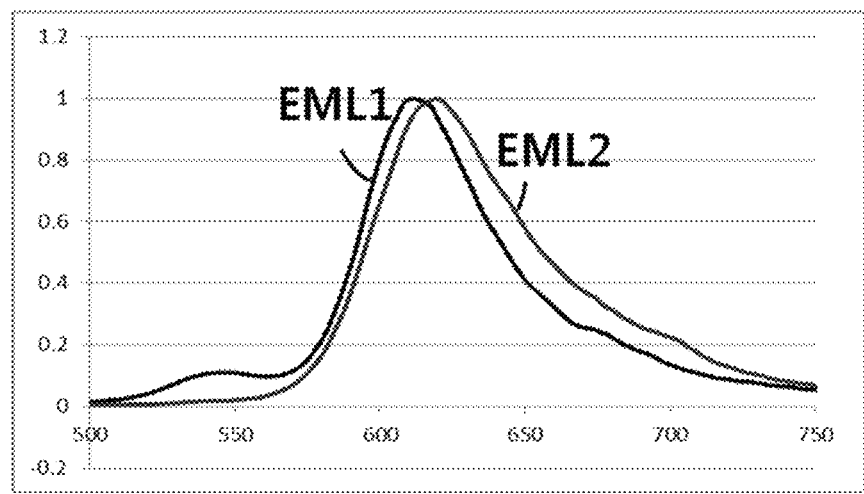
FIG. 4 is a graph showing an electroluminescence (EL) spectrum of first and second emissive layers in an organic light emitting device according to an example of the present invention.

FIG. 1 is a cross-sectional view of an organic light emitting device according to an embodiment of the present invention. FIG. 2 is a schematic diagram illustrating structures of first and second emissive layers of FIG. 1. FIG. 3 is a graph showing PL spectrum of a dopant and first and second hosts used in first and second emissive layers in an organic light emitting device according to the present invention. FIG. 4 is a graph showing an electroluminescence (EL) spectrum of first and second emissive layers in an organic light emitting device according to the present invention. All the components of each of an organic light emitting device and an organic light emitting display device having the organic light emitting device according to all embodiments of the present invention are operatively coupled and configured.

As shown in FIG. 2, the organic light emitting device according to the present invention may include a first electrode 110 and a second electrode 160, which face each other, and a light emitting portion 140 including first and second emissive layers 141 and 142 that contact each other in a thickness direction between the first electrode 110 and the second electrode 160.

Here, as shown in FIGS. 1 to 3, the first emissive layer 141 may include a first host h1 of a photoluminescence (PL) spectrum with a peak in a first wavelength λ1 and the second emissive layer 142 may include a second host h2 of a PL spectrum with a peak in a second wavelength λ2 spaced apart from the first wavelength λ1.

The first and second emissive layers 141 and 142 may further include a dopant d of a PL spectrum with a peak in the same wavelength λ3. A wavelength in which each of the first and second emissive layers 141 and 142 substantially emits light is a peak of a PL spectrum of the dopant d or a wavelength around the peak and the illustrated example is the light emitting portion 140 that emits light in a red wavelength. Hosts with different PL spectrums are used in different emissive layers, in particular, a red light emitting portion of the organic light emitting device according to the present invention to overcome a problem in that a visual change in red is well recognized in response to a change in viewing angle. As necessary, light emitting portions with different colors as well as the red light emitting portion in the illustrated example may also include two layers, thereby enhancing a viewing angle and a lifespan.

In general, a PL spectrum refers to photoluminescence characteristics for each wavelength but the first hosts h1 and h2 of the organic light emitting device according to the present invention transmits energy to the dopant d in each emissive layer so as to cause photoluminescence in a PL spectrum of a dopant instead of directly emitting light in a region in which the PL spectrum is shown.

In the organic light emitting device according to the present invention, a single host and a single dopant with different PL spectrums may be used in the first and second emissive layers 141 and 142. As such, a single host is used in each emissive layer to overcome a problem in that a light emitting region in an emissive layer is slightly changed or a lifespan is reduced due to interface accumulation of a dopant although the emissive layer has high efficiency in an initial state when two or more mixed materials are used as a host.

Peak wavelengths of the first host h1 and the second host h2 may be spaced apart from each other by 15 nm to 123 nm. An EL spectrum may be actually shown in a corresponding wavelength to cause photoluminescence only when PL spectrums of both the first hosts h1 and h2 need to at least partially overlap with a PL spectrum of the dopant d in a light emitting wavelength range and, thus, the first hosts h1 and h2 with a PL spectrum that overlaps with that of a dopant may be selected in consideration of arrangement of the PL spectrum of the dopant.

Peak wavelengths of the first hosts h1 and h2 need to be spaced apart from each other by at least 15 nm to select materials with different PL spectrums and to relatively compensate for insufficient viewing angle characteristics or lifetime characteristics between hosts.

The first host h1 may be spaced apart from the second host h2 in the right direction by about 123 nm or less such that a PL spectrum of the second host h2 does not exceed that of the dopant d while overlapping with the PL spectrum of the dopant d. With regard to a degree by which the second host h2 is spaced apart from the first host h1 in the left direction, the first and second hosts h1 and h2 need to at least partially overlap with the PL spectrum of the dopant d and, thus, a degree by which a peak wavelength of the second host h2 is spaced apart from that of the first host h1 in the left direction may be 30 nm or less.

A wavelength in which the first and second emissive layers 141 and 142 emit light is a peak of the PL spectrum of the dopant d or a wavelength around the peak because the hosts h1 and h2 of each emissive layer absorb energy in the PL spectrum and transmit the absorbed energy to the dopant d to generate substantial excitation energy and to cause photoluminescence in a wavelength of the PL spectrum of the dopant d. In addition, a location of the light emitting portion 140 between the first and second electrodes 110 and 160 may be set in a thickness direction of the first and second electrodes 110 and 160 depending on a resonance condition of a corresponding wavelength in which a light emitting portion emits light and, in this regard, a light emitting region of the first and second emissive layers 141 and 142 may be related to a wavelength of the dopant d and outcoupling characteristics of each emissive layer may be set depending on PL characteristics of a dopant.

As shown in FIG. 4, an electroluminescence (EL) spectrum of each of the first and second emissive layers 141 and 142 is defined in a portion in which PL spectrums of the host h1 and h2 and the dopant d overlap with each other and, in particular, a weight is applied to a PL spectrum of a dopant related to outcoupling to generate an EL spectrum. The first emissive layer 141 (EML1) has a PL spectrum over a wide wavelength range and the second emissive layer 142 (EML2) has a PL spectrum over a relatively narrow wavelength range and, substantially, a first peak wavelength $\lambda 1$ of the PL spectrum of the first host h1 in the first emissive layer 141 is on the right side of a second peak wavelength $\lambda 2$ of the PL spectrum of the second host h2 in the second emissive layer 142 but the EL spectrum of the first emissive layer 141 is positioned on the slightly left side of the EL spectrum of the second emissive layer 142. Here, when maximum intensity of a PL spectrum of each host is 1, each PL spectrum of FIG. 3 is obtained by normalizing intensity of PL characteristics of the first host in proportion to the maximum intensity 1 and, in this case, it seems that an overlapping region between PL spectrums of the second host and the host is not nearly present in the graph of FIG. 4 but, in the case of an actual value prior to normalization, there is an overlapping region with a small area between PL spectrums of the dopant d and the second host h1. This may be seen from EL spectrums of the first and second emissive layers EML1 and EML2 of FIG. 4.

That is, the PL spectrum of the second host h2 in the second emissive layer 142 has intensity that is a small value but is almost uniform in a wavelength range shown in the PL spectrum of the dopant d and, accordingly, an EL spectrum defined by product of a PL spectrum of an emissive layer (an overlapping region between PL spectrums of a host and a dopant of each emissive layer) and an outcoupling curve is nearly similar to the PL spectrum of the dopant d of the second emissive layer 142 so as to have the same peak wavelength $\lambda 3$ as the peak wavelength of the PL spectrum of the dopant d.

On the other hand, the PL spectrum of the second host h2 in the first emissive layer 141 and the PL spectrum of the dopant d have an overlapping region that is gradually reduced from 540 nm to 730 nm of a wavelength range shown in the PL spectrum of the dopant d and, accordingly, the EL spectrum defined by product of the PL spectrum of the emissive layer and the outcoupling curve may be shifted in the left direction based on a curve of the EL spectrum of the first emissive layer 141 and may have weak impulse characteristics in a wavelength of about 540 nm with high intensity of the PL spectrum of the first host h1.

The organic light emitting device according to the present invention may be basically configured to include the first and second electrodes 110 and 160 and the light emitting portion 140 disposed therebetween and including the first and second emissive layers 141 and 142 that contact each other as shown in FIG. 2 and may include a common layer between the first electrode 110 and the light emitting portion 140 and between the second electrode 160 and the light emitting portion 140 as shown in FIG. 1. In reference numerals that are not described with reference to FIG. 1, a reference numeral 120 refers to a hole injection layer, a reference numeral 130 refers to a hole transport layer, and the hole injection layer 120 and the hole transport layer 130 may be disposed between the first electrode 110 and the light emitting portion 140 and may each include a single or plural layers. In addition, a reference numeral 150 refers to an electron transport layer and the electron transport layer 150 may be disposed between the light emitting portion 140 and the second electrode 160. A different form of layer from in FIG. 1 may be added or some of the common layers of FIG. 1 may be omitted from the organic light emitting device of FIG. 2 that is a basic form.

For example, in the case of a top emission type, the first electrode 110 may be formed by stacking a translucent reflective electrode and a transparent conductive electrode such as indium tin oxide (ITO), indium zinc oxide (IZO), $SnO_2$, or $ZnO_2$ and the second electrode 160 may be selected from metal with a small work function among light transmissive electrodes. In this case, an electron injection layer may be further formed of a metal monolith including alkali metal such as Li, Na, and, K, alkaline earth metal such as Mg and Ca, rare earth metal such as Eu, an alloy of these metals and Al, Ag, In, or the like, or a compound mixed with inert gas such as F between the second electrode 160 and the electron transport layer 150.

Although FIG. 1 illustrates an example in which the first electrode 110 and the second electrode 160 are an anode and a cathode, respectively, the second electrode 160 and the first electrode 110 may oppositely be an anode and a cathode, respectively.

Alternatively, in the case of a bottom emission type, the first electrode 110 may be the aforementioned transparent conductive electrode and the second electrode 160 may be a reflective electrode.

The PL spectrum and the EL spectrum of FIGS. 3 and 4 are results when the first hosts h1 and h2 are selected as the following materials.

That is, the first host h1 is a host material having a PL spectrum with a peak wavelength of 497 nm and a full width of half maximum (FWHM) of 117 nm and the second host h2 is a host material having a PL spectrum with a maximum intensity of peak wavelength of 472 nm and a FWHM of 50 nm, and in this case, the first host h1 has PL spectrum characteristics in a relatively wide wavelength range, the second host h2 has PL spectrum characteristics in a narrower wavelength range than the former wavelength range, and hosts used in the first and second emissive layers 141 and 142 that contact each other may have PL characteristics with different tendencies.

In each emissive layer, the dopant d used along with the first host h1 or the second host h2 may have a peak wavelength of 620 nm and a FWHM of 59 nm.

The proposed example is an example for defining the organic light emitting device according to the present invention but is not limited thereto and, thus, the first and second emissive layers 141 and 142 have the same dopants d with peak characteristics in a wavelength of 610 nm to 630 nm and a region in which a dopant causes photoluminescence is a red wavelength. A FWHM of the dopant d may also be changed in a range of 100 nm or less depending on a used material.

In addition, a peak wavelength may also be adjusted in a range of 495 nm to 500 nm depending on a host material used in the first host h1 and the second host h2 may be selected from materials with a peak wavelength that is spaced apart from the peak wavelength of the first host in the left direction by 15 nm to 30 nm. A FWHM of the PL spectrum of the first host h1 may be 100 nm to 130 nm and a FWHM of the PL spectrum of the second host h2 may be ½ or less of the FWHM of the first host h1 and, in this regard, the first hosts h1 and h2 may be hosts that function as complementary characteristics with respect to a dopant for photoluminescence in the same wavelength.

As shown in FIG. 4, the PL spectrums of the first host h1 and the second host h2 may have respective overlapping regions with the PL spectrum of the dopant d and the overlapping region between the PL spectrums of the first host h1 and the dopant d may be larger than the overlapping region between the PL spectrums of the second host h2 and the dopant d.

Here, the EL spectrum defined by product of a PL spectrum of an overlapping region between the first host and the dopant in the first emissive layer 141 and an outcoupling curve may have a tendency in which an EL spectrum is shown in a wavelength of a first host as well as a wavelength of a dopant compared with the EL spectrum defined by product of a PL spectrum of an overlapping region between the second host h2 and the dopant d in the second emissive layer 142 and an outcoupling curve. It may be seen that weak photoluminescence of the first host occurs in the first emissive layer 141 because an overlapping region between PL spectrums of the first host and the dopant is meaningful.

However, in the organic light emitting device according to the present invention, the light emitting portion 140 may be formed by stacking the first and second emissive layers 141 and 142 that simultaneously emit light and, in this regard, photoluminescence in a red wavelength occurs at a level of intensity 1 in the first and second emissive layers 141 and 142 and photoluminescence of the first host h1 occurs at a level of 1/10 or less of the former level, which is not a level that is visually recognizable by the human.

A peak of an EL spectrum of the first and second emissive layers 141 and 142 is generated in a wavelength of '−10 nm of a PL peak wavelength of the dopant' and '+10 nm of a PL peak wavelength of the dopant of the first and second emissive layer' and generated in a PL peak wavelength of a dopant or a wavelength around the PL peak wavelength.

Even if the first and second emissive layers 141 and 142 use two emissive layers in the organic light emitting device, the thickness of the light emitting portion 140 is not increased and, in general, the first and second emissive layers 141 and 142 may be arranged with an appropriate thickness to a resonance condition to emit corresponding color in a thickness direction between the first and second electrodes 110 and 160 and an entire thickness of the light emitting portion 140 is the same as the thickness (refer to a thickness of a comparative example) of an emissive layer used as a generally single layer.

According to the present invention, the first and second emissive layers 141 and 142 including hosts with different PL spectrums to improve viewing angle characteristics and lifespan characteristics.

In the organic light emitting device according to the present invention, the first host h1 used in each of the first and second emissive layers 141 and 142 may have a band gap of 2.85 eV, an LUMO energy level of −2.5 eV, and a HOMO energy level of −5.35 eV and the second host h2 may have a band gap of 2.77 eV, an LUMO energy level of −2.72 eV, and a HOMO energy level of −5.49 eV and, thus, the first host h1 and the second host h2 may use different materials.

Hereinafter, the viewing angle and lifetime of the organic light emitting device according to the present invention will be described based on an experiment to be compared with the comparative example.

The following comparative example will be described based on the same device for emitting red light.

Figure 5:
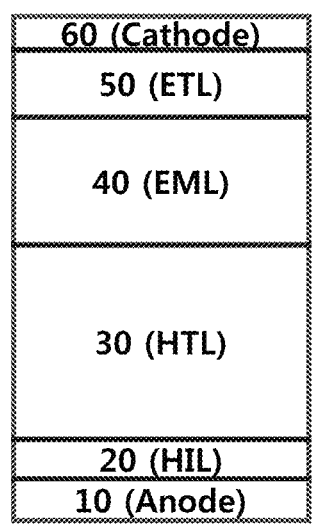
FIG. 5 is a cross-sectional view illustrating an organic light emitting device according to the comparative example.

FIG. 5 is a cross-sectional view illustrating an organic light emitting device according to the comparative example.

As shown in FIG. 5, the organic light emitting device according to the comparative example is configured in such a way that a hole injection layer 20, a hole transport layer 30, an emissive layer 40, and an electron transport layer 50 are sequentially formed between an anode 10 and a cathode 60 and is different from the organic light emitting device according to the present invention in that the emissive layer 40 includes a single emissive layer formed of a single host and dopant.

Hereinafter, an experimental example will be described when the organic light emitting device according to the comparative example is classified into a first comparative example EML_R1 and a second comparative example EML_R2 depending on host materials used in the emissive layer 40.

Figure 6:
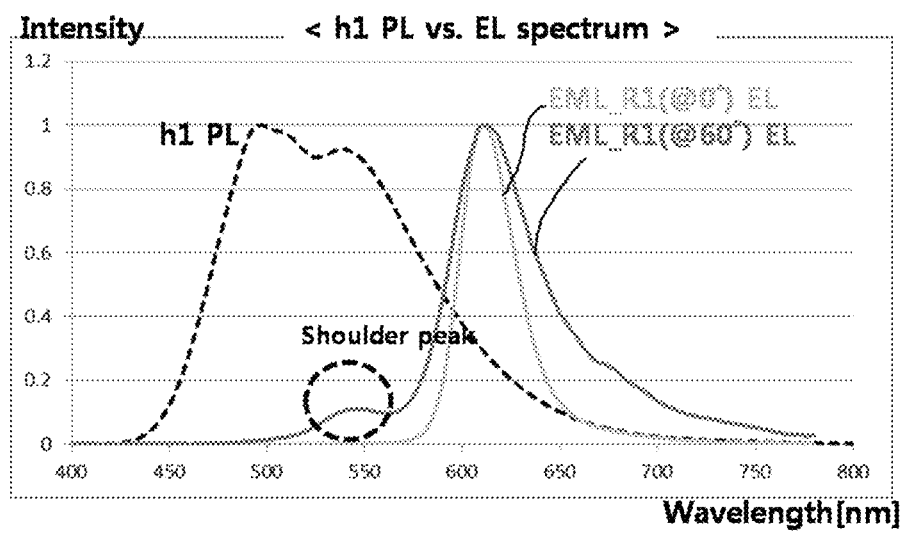
FIG. 6 is a graph showing an EL spectrum at viewing angles of 0 and 60 degrees when an emissive layer of an organic light emitting device according to the first comparative example includes a first host.

FIG. 6 is a graph showing an EL spectrum at viewing angles of 0 and 60 degrees when an emissive layer of an organic light emitting device according to the first comparative example includes a first host.

As shown in FIG. 6, in the first comparative example EML_R1, when a single emissive layer includes the first host h1 and the (red) dopant d, a PL spectrum of the first host h1 is shown over a wide wavelength range and an EL spectrum shown at a viewing angle of 0 degree has an almost peak wavelength of 612 nm and is a steep curve shown around a peak wavelength. It may be seen that, when a viewing angle is 60 degrees, a shoulder peak is generated in a wavelength of 540 to 550 nm with high intensity of the PL spectrum of the first host h1.

This means that an overlapping region between PL spectrums of the first host h1 and the dopant d is gradually increased with an increased viewing angle and a color change depending on a viewing angle is high and that a viewing angle is changed and color purity of emitted light is degraded.

Figure 7:
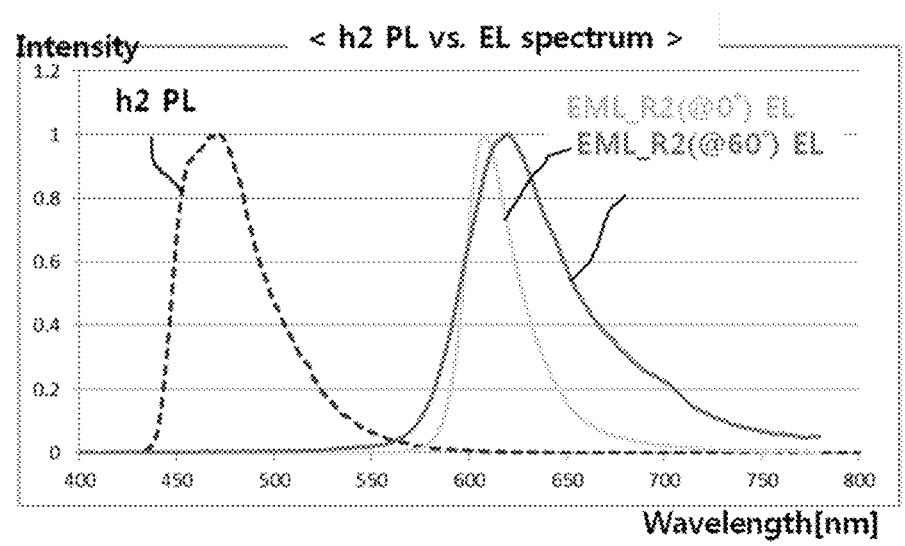
FIG. 7 is a graph showing an EL spectrum at a viewing angle of 0 and 60 degrees when an emissive layer of an organic light emitting device according to a second comparative example includes a second host.

FIG. 7 is a graph showing an EL spectrum at a viewing angle of 0 and 60 degrees when an emissive layer of an organic light emitting device according to a second comparative example includes a second host.

As seen from FIG. 7, in the second comparative example EML R2, when an emissive layer includes the second host h2 and the (red) dopant d, PL characteristics between the second host and the dopant do not nearly overlap with each other, an overlapping region between PL spectrums of the second host h2 and the dopant is regularly shown in a wavelength of the dopant d with weak intensity, a shoulder peak is not observed at both the viewing angles of 0 and 60 degrees, and an EL spectrum corresponding to the PL characteristics of the dopant d is almost shown, in a normalized condition.

At a viewing angle of 60 degrees, an EL spectrum is shown in a wider width than at a viewing angle of 0 degree but a peak wavelength is shown in a red wavelength in the same tendency and, thus, this means that, even if a viewing angle is changed, photoluminescence characteristics of red color is maintained and a color change is low in the second comparative example.

The present invention may simultaneously enhance a viewing angle and a lifespan by including the first and second emissive layers in the first hosts h1 and h2 according to the aforementioned first and second comparative examples. Hereinafter, according to the first comparative example, a single emissive layer uses a first host and a dopant, according to the second comparative example, a single emissive layer uses a second host and a dopant, whereas according to an embodiment of the present invention, first and second emissive layers include first and second hosts and each emissive layer uses a dopant. Dopants used in these emissive layers may use the same red dopant. In addition, a ratio of the first and second emissive layers used in the embodiment of the present invention may be 1:1, a total thickness of a light emitting portion formed by summing these may be the same as a thickness of each emissive layer according to the first and second comparative examples, and the experiment may be performed.

Figure 8A:
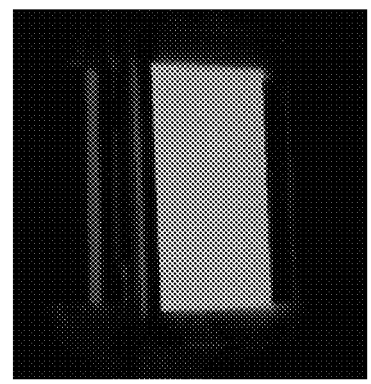
FIGS. 8A and 8B are images viewed at a viewing angle of 60 degrees according to a first comparative example and an embodiment of the present invention.
Figure 8B:
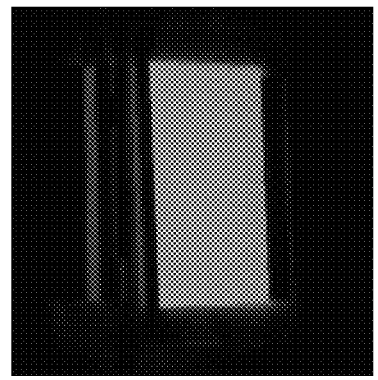

FIGS. 8A and 8B are images viewed at a viewing angle of 60 degrees according to a first comparative example and an embodiment of the present invention.

As seen from FIG. 8A, color purity at a viewing angle of 60 degrees according to the first comparative example is reduced to be indicated to be orange color.

On the other hand, as seen from FIG. 8B, reduction in color purity is alleviated at a viewing angle of 60 degrees according to the embodiment of the present invention.

Figure 9:
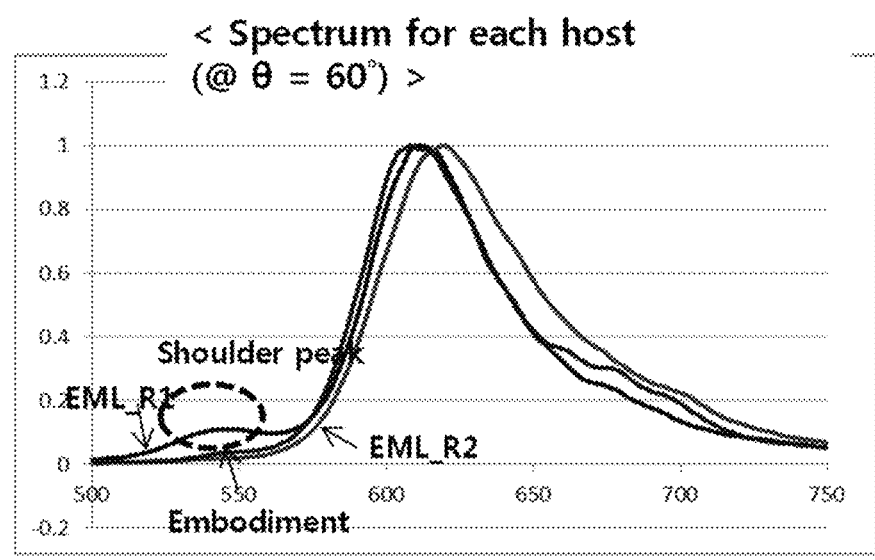
FIG. 9 is a graph showing comparison between an EL spectrum according to first and second comparative examples and an EL spectrum of an organic light emitting device according to an example of the present invention.

FIG. 9 is a graph showing comparison between an EL spectrum according to first and second comparative examples and an EL spectrum of an organic light emitting device according to the present invention.

The EL spectrums of FIG. 9 are observed at a viewing angle of 60 degrees and it may be seen that the aforementioned shoulder peak of the EL spectrum of the first comparative example EML_R1 is generated in a wavelength range of about 540 nm to 550 nm. On the other hand, it may be seen that the shoulder peak is prevented from being generated in the EL spectrum according to the second comparative example EML R2 and the EL spectrum according to the embodiment of the present invention.

Figure 10:
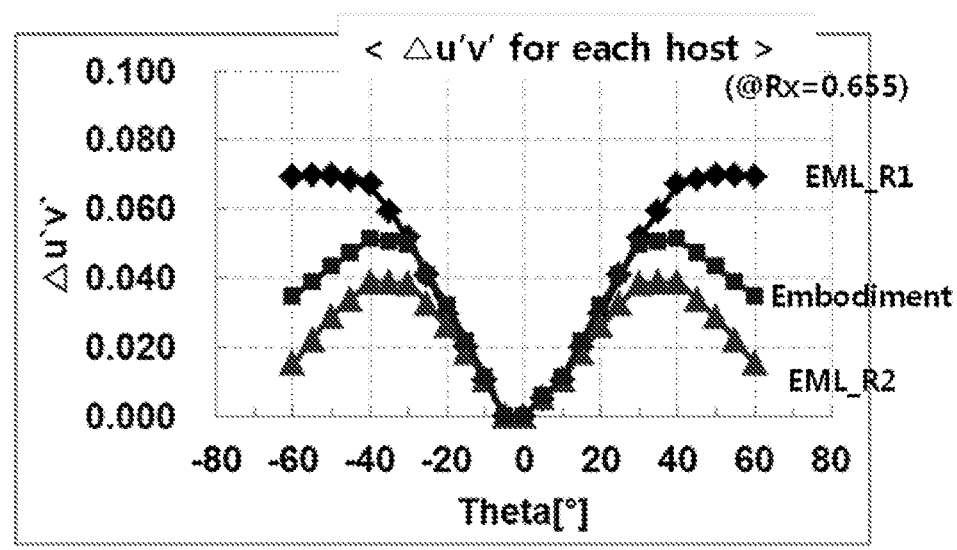
FIG. 10 is a graph showing a change in $\Delta u'v'$ for each viewing angle of an organic light emitting device according to the first and second comparative examples and the present invention.

FIG. 10 is a graph showing a change in Δu'v' for each viewing angle of an organic light emitting device according to the first and second comparative examples and the present invention.

As seen from FIG. 10, a change in Δu'v' indicating a visual change is increased to 0.070 when a viewing angle is changed to 60 degrees from 0 degree in the first comparative example EML_R1. However, when an organic light emitting device according to the embodiment of the present invention exhibits a similar shape to the second comparative example EML_R2 and a viewing angle is changed, it may be numerically seen that a maximum change in Δu'v' is a level of 0.050 and a visual change for each viewing angle compared with the aforementioned first comparative example is reduced.

The above experiments show that the second host is relatively excellent compared with the first host in terms of visual characteristics and color purity depending on a change in viewing angle. However, as described later, the second host is vulnerable with respect to a lifespan and, thus, the organic light emitting device according to the present invention may use the durability of the first host instead of using only the second host alone in consideration of a lifespan as well as visual characteristics and color purity depending on a change in viewing angle. In addition, the first and second emissive layer are separately used to prevent a lifetime of the organic light emitting device from being reduced due to accumulation of dopants or hosts in an emissive layer in the case of a slight change.

Figure 11:
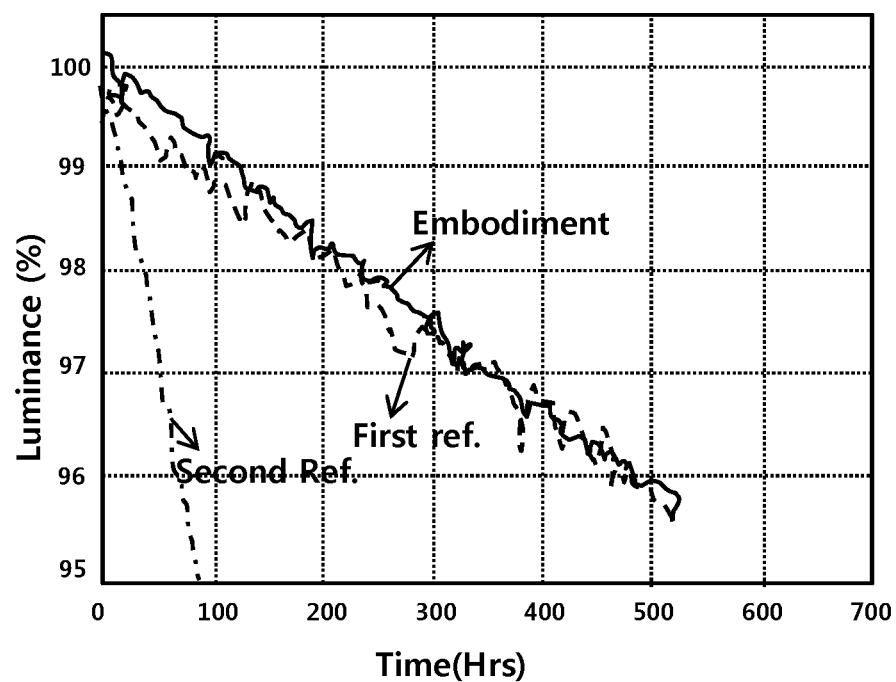
FIG. 11 is a graph showing a lifespan of an organic light emitting device according to the first and second comparative examples and the present invention.

FIG. 11 is a graph showing a lifespan of an organic light emitting device according to the first and second comparative examples and the present invention.

As seen from FIG. 11, with regard to the first and second comparative examples EML_R1 and EML_R2 and an embodiment of the present invention when initial luminance is degraded to luminance at a level of 95%, a lifespan in the case of the second comparative example EML_R2 is less than 90 hours but a lifespan in the first comparative example and an embodiment of the present invention is equal to or greater than about 600 hours, and when the organic light emitting device according to the present invention is used, a lifetime is enhanced by 7 times or more of the second comparative example. In detail, when initial luminance is degraded to a level of 95%, a lifetime of the organic light emitting device according to the embodiment of the present invention is enhanced to a level of 102% compared with the first comparative example EML_R1 and, thus, it may be seen that the lifetime in the present invention is more enhanced compared with the first comparative example, the case in which luminance is reduced to 50% or more when the organic light emitting device is applied to an actual display device may also be considered and, thus, increase in lifespan may be expected to be further increased in the actual display device.

Hereinafter, electro-optic characteristics according to the first and second comparative examples and electro-optic characteristics according to an embodiment of the present invention will be compared with each other from Table 1 below.

TABLE 1

| Division | Driving Voltage (V) | Current Density (mA/cm$^2$) | Luminance (Cd/A) | CIEx | CIEy |
| --- | --- | --- | --- | --- | --- |
| First Comparative Example | 4.9 | 11.5 | 54.4 | 0.664 | 0.333 |
| Second Comparative Example | 5.1 | 13.4 | 48.6 | 0.657 | 0.340 |
| Embodiment of present invention | 4.5 | 10.0 | 65.7 | 0.655 | 0.343 |

Among materials used in the first comparative example and the second comparative example, the first host is excellent in terms of a lifespan and the second host is uniquely excellent in that there is no visual reduction depending on a change in viewing angle and color purity is excellent but these characteristics (in terms of viewing angle and lifespan) are not be enhanced using only an emissive layer of a single layer according to comparative examples.

As seen from Table 1 above, a driving voltage V is enhanced via the structure of the light emitting portion used in an embodiment of the present invention and luminance characteristics may also be enhanced in the first and second comparative examples EML_R1 and EML_R2. It may be expected that color coordinates CIEx and CIEy according to an embodiment of the present invention are similar to in the second comparative example and, thus, it is advantageous in terms of excellent color purity and low visual reduction according to the second comparative example.

That is, when an embodiment of the present invention is used, compared with the first comparative example, luminance efficiency is enhanced by 121% and, compared with the second comparative example, luminance efficiency is enhanced by 135% and, accordingly, it may be seen that both a driving voltage and photoluminescence characteristics of luminance are enhanced compared with both the first and second comparative examples.

Hereinafter, an experimental example in the case in which a thickness ratio of a first emissive layer and a second emissive layer is changed in a light emitting portion used in an organic light emitting device according to the present invention will be described.

In this experiment, examples obtained by changing a thickness ratio are referred to as a first experimental example, a second experimental example, a third experimental example, a fourth experimental example, and a fifth experimental example, and a thickness ratio of the first emissive layer and the second emissive layer are 3:1, 2:1, 1:1, 1:2, and 1:3. In addition, a total thickness of a light emitting portion formed by summing the first and second emissive layers may be common as 360 Å. In the first and second comparative examples to be compared with these experimental examples, a thickness of a single emissive layer is also 360 Å and materials used in a single emissive layer are a single first or second host and a dopant.

TABLE 2

| Division | light emitting portion | Driving Voltage (V) | Current Density (mA/cm²) | Luminance (Cd/A) | CIEx | CIEy |
|---|---|---|---|---|---|---|
| First Comparative Example | h1 (360 Å) | 4.9 | 11.5 | 54.4 | 0.664 | 0.333 |
| Second Comparative Example | h2 (360 Å) | 5.1 | 13.4 | 48.6 | 0.657 | 0.340 |
| First Experiment Example | h1(270 Å)/ h2(90 Å) | 4.5 | 10.1 | 62.1 | 0.664 | 0.333 |
| Second Experiment Example | h1(240 Å)/ h2(120 Å) | 4.5 | 9.9 | 66.5 | 0.655 | 0.342 |
| Third Experiment Example | h1(180 Å)/ h2(180 Å) | 4.5 | 10.0 | 65.7 | 0.655 | 0.343 |
| Fourth Experiment Example | h1(120 Å)/ h2(240 Å) | 4.5 | 10.7 | 62.5 | 0.653 | 0.344 |
| Fifth Experiment Example | h1(90 Å)/ h2(270 Å) | 5.0 | 10.6 | 60.6 | 0.658 | 0.339 |

As seen from the above electro-optic characteristics, the first to fourth experimental examples have the same reduction in driving voltage and similar enhancement in luminance. In addition, color coordinate characteristics are also similar to the second comparative example to have excellent color purity.

TABLE 3

| Division | Lifetime (L95) | Δu'v' (Max, Red) |
|---|---|---|
| First Comparative Example | 100% | 0.0694 |
| Second Comparative Example | 15% | 0.0389 |
| First Experiment Example | 91% | 0.0681 |
| Second Experiment Example | 87% | 0.0643 |
| Third Experiment Example | 102% | 0.0543 |
| Fourth Experiment Example | 82% | 0.0489 |
| Fifth Experiment Example | 22% | 0.0414 |

As seen from the above experiments, when a lifespan in the first comparative example is 100% and lifespan (L95: which is a time period up to a level of 95% at initial luminance) in the first to fifth experimental examples are compared, even if a second material is mixed in the third experimental example, a lifespan is increased and lifespan in the first to fourth experimental examples are a reliable level of 82% or more.

As Δu'v' which indicates a visual change depending on a viewing angle is reduced, Δu'v' is excellent but efficiency and driving voltage characteristics of Table. 2 and lifespan of Table 3 need to be considered. In consideration of the case in which a driving voltage is reduced compared with the comparative examples along with a condition of lifespan of 80% or more, it may be seen that visual enhancement is enhanced and a driving voltage and lifespan are also uniformly excellent depending on a change in viewing angle in the second to fourth experimental examples.

The viewing angle characteristics of the second to fourth experimental examples will be described with reference to the drawings.

Figure 12:
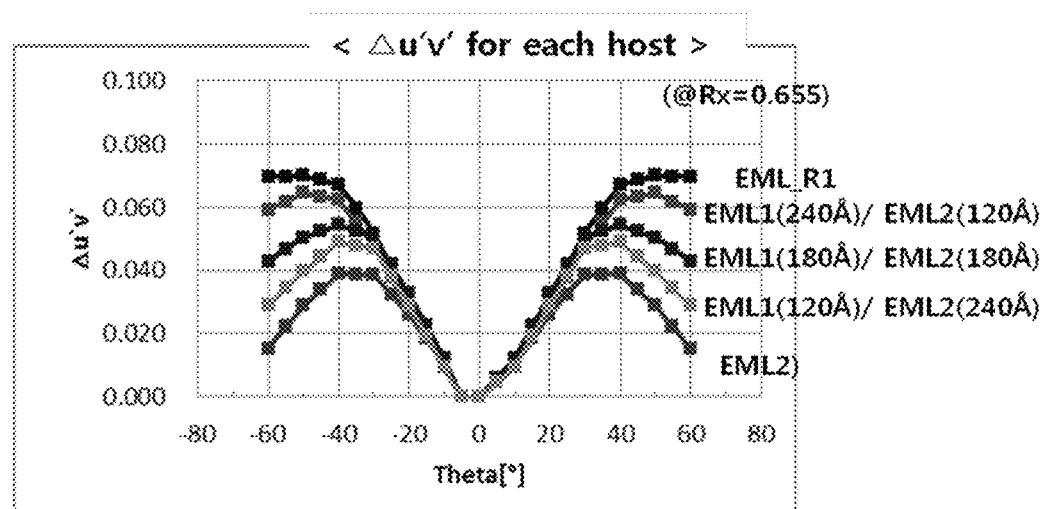
FIG. 12 is a graph showing a change in $\Delta u'v'$ for each viewing angle in the second to fourth experimental examples of an organic light emitting device according to the first and second comparative examples and an embodiment of the present invention.

FIG. 12 is a graph showing a change in Δu'v' for each viewing angle in the second to fourth experimental examples of an organic light emitting device according to the first and second comparative examples and an embodiment of the present invention.

As shown in FIG. 12, the first to third experimental examples show Δu'v' characteristics between the first and second comparative examples, and it may be seen that Δu'v' is degraded compared with the first comparative example and that reduction in Δu'v' depending on a change in viewing angle is low compared with the first comparative example.

Like in the third experimental example among the first to third experimental examples, when a thickness of the second emissive layer 142 is further increased, it may be seen that a visual change depending on a change in viewing angle is smallest due to a small value of Δu'v'.

The organic light emitting device according to the present invention may enhance a lifespan as well as a change in viewing angle and, in this regard, it is not always good when the second emissive layer 142 is thicker than the first emissive layer 141, thicknesses of the first emissive layer 141: the second emissive layer 142 may be adjusted in the range of 1:0.5 to 1:2 in consideration of lifespan, and it may be seen that the aforementioned experiments of FIG. 12 and Table 2 have an effect in this range. When the thickness of the first emissive layer 141 is about 1, the thickness of the second emissive layer 142 may be adjusted to twice from half the thickness of the first emissive layer 141 and the thickness of the light emitting portion 140 formed by summing the first and second emissive layers 141 and 142 may not exceed 500 Å.

As seen from the first to third experimental examples, when a thickness ratio of the first and second emissive layers is 1:1, lifespan, photoluminescence characteristics, and visual reduction depending on a change in viewing angle are enhanced, which corresponds to a most excellent degree.

Hereinafter, a method of manufacturing an organic light emitting device according to the present invention, in particular, a manufacturing of a light emitting portion will be described.

Figure 13:
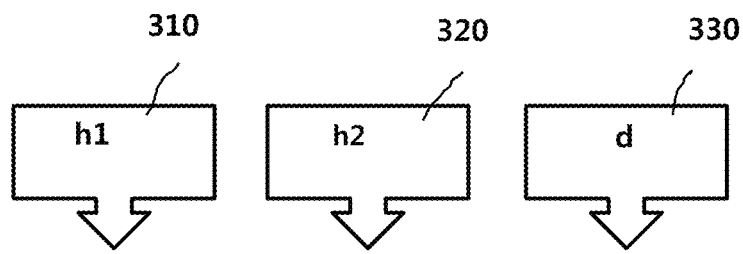
FIG. 13 is a diagram illustrating showing a method of manufacturing an organic light emitting device according to an embodiment of the present invention.
Figure 13:
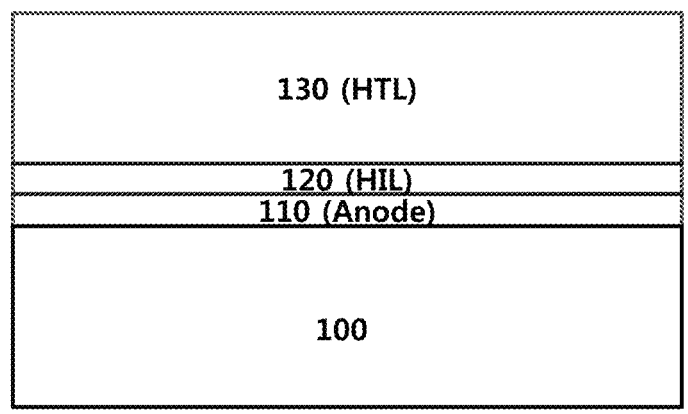

FIG. 13 is a diagram illustrating showing a method of manufacturing an organic light emitting device according to the present invention.

As shown in FIG. 13, the organic light emitting device according to the present invention may be manufactured by forming a first electrode 110 (refer to FIG. 1), a hole injection layer 120, and a hole transport layer 130 on a substrate 100, moving the substrate 100 into a chamber containing a first host supplying source 310, a second host supplying source 320, and a dopant supplying source 330, primarily forming the first emissive layer 141 with the first host and dopant supplied from the first host supplying source 310 and the dopant supplying source 330 on the hole transport layer 130, closing the first host supplying source 310 and opening the second host supplying source 320 and, then, forming the second emissive layer 142 with the second host and dopant supplied from the second host supplying source 320 and the dopant supplying source 330.

That is, the dopant may be continuously supplied during formation of the first and second emissive layers 141 and 142 and only the first hosts h1 and h2 may be separately supplied to the first and second emissive layers 141 and 142.

Then, the electron transport layer 150 and the second electrode 160 may be sequentially formed on the second emissive layer 142.

Figure 14:
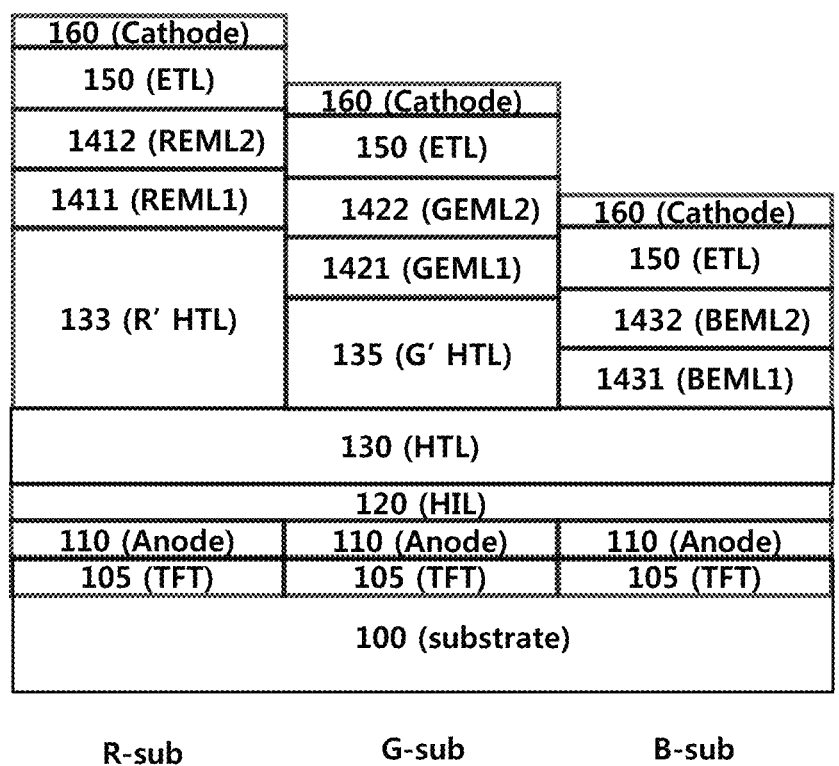
FIG. 14 is a cross-sectional view of an organic light emitting display device according to an embodiment of the present invention.

FIG. 14 is a cross-sectional view of an organic light emitting display device according to the present invention.

The organic light emitting display device according to the present invention in FIG. 14 may include the substrate 100 including a plurality of sub pixels (R-sub, G-sub, and B-Sub), thin film transistors (TFTs) 105 included in the respective sub pixels, and the aforementioned organic light emitting device according to the present invention that is connected to the TFT 105 and the respective sub pixels.

Red, green, and blue sub pixels (R-sub, G-sub, and B-Sub) may be regularly repeated on the substrate 100, one or more TFTs 105 may be disposed on each sub pixel, and at least one thereamong may be connected to the first electrode 110 or the second electrode 160 of each organic light emitting device. Although an example in which the first electrode 110 and the TFT 105 are connected is illustrated, the present invention is not limited thereto and, thus, the organic light emitting device of FIG. 1 or 2 is reversed such that the second electrode 160 and the TFT 105 are connected.

The thin film transistor may basically include an active layer, a gate electrode disposed to overlap on the active layer, and a source electrode and a drain electrode which are connected to opposite sides of the active layer, the used active layer may be configured by amorphous silicon, poly silicon, oxide semiconductor, or a combination thereof, and a structure of the thin film transistor may be a generally known structure.

As shown in FIG. 14, the organic light emitting device according to the present invention may have an emissive layer including double layers that contact each other in a thickness direction between the facing first and second electrodes 110 and 160 and have hosts with different PL characteristics. That is, the red sub pixel R-sub may include a first red emissive layer (REML1) 1411 and a second red emissive layer (REML2) 1412, the green sub pixel G-sub may include a first green emissive layer (GEML1) 1421 and a second green emissive layer (GEML2) 1422, and the red sub pixel B-sub may include a first blue emissive layer (BEML1) 1431 and a second blue emissive layer (BEML2) 1432.

The red sub pixel R-sub and the green sub pixel G-sub may include a first auxiliary hole transport layer (R' HTL) 133 and a second auxiliary hole transport layer (G' HTL) 135, respectively, to adjust a location between the first and second electrodes 110 and 160 for adjusting a resonance condition of light emission.

Commonly to the sub pixels, the hole injection layer 120 and the hole transport layer 130 may be sequentially disposed from the bottom between the first electrodes 110 and the first and second auxiliary hole transport layers 133 and 135 and the first blue emissive layer (BEML1) 1431.

Commonly to the sub pixels, the electron transport layer 150 may be disposed between the second emissive layers 1412, 1422, and 1432 and the second electrode 160.

Although an example in which the first electrode 110 and the second electrode 160 are an anode and a cathode, respectively, is illustrated, the first electrode 110 and the second electrode 160 may be revered and thus may be an anode and a cathode, respectively.

Although FIG. 14 illustrates an example, the organic light emitting display device is configured in such a way that each color sub pixel includes an emissive layer with double layers, the organic light emitting display device according to the present invention is not limited thereto and, thus, this may be applied only to a sub pixel with color that is not capable of acquiring uniform color viewing angle characteristics via only a single emissive layer. That is, the case in which the organic light emitting display device according to the present invention includes first and second emissive layers including hosts with different PL spectrums may be applied to at least one sub pixel among a plurality of sub pixels included in a substrate.

The organic light emitting device and the organic light emitting display device using the same according to the present invention may have the following advantages.

The organic light emitting device and the organic light emitting display device using the same according to the present invention may be formed by layering emissive layers by using hosts with different PL characteristics and the same dopant to prevent reduction in color purity depending on a viewing angle and to prevent photoluminescence of the host, thereby enhancing color reliability and enhancing a lifespan.

When an emissive layer includes double layers, a driving voltage may be reduced and luminance may be enhanced compared with in the case in which an emissive layer includes a single layer.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting device comprising:
   first and second electrodes facing each other; and
   a light emitting portion comprising first and second emissive layers that contact each other in a thickness direction between the first and second electrodes,
   wherein the first emissive layer comprises a first host and a first dopant, a photoluminescence (PL) spectrum of the first host having a peak in a first wavelength, and
   wherein the second emissive layer comprises a second host and a second dopant, a PL spectrum of the second host having a peak in a second wavelength, and the peak in the second wavelength being apart from the peak in the first wavelength by approximately 15 nm to 123 nm.

2. The organic light emitting device according to claim 1, wherein the first dopant and the second dopant has a PL spectrum having a peak in the same wavelength.

3. The organic light emitting device according to claim 2, wherein the first and second dopants are the same and have PL spectrums with a peak in a wavelength of approximately 610 nm to 630 nm.

4. The organic light emitting device according to claim 3, wherein PL spectrums of the first host and the second host have an overlapping region with the PL spectrum of the first and second dopants, and
wherein an overlapping region between the PL spectrum of the first host and the PL spectrum of the first and second dopants is greater than an overlapping region between the PL spectrum of the second host and the PL spectrum of the first and second dopants.

5. The organic light emitting device according to claim 4, wherein the first wavelength is approximately 495 nm to 500 nm, and
wherein the second wavelength is spaced apart from the first wavelength in the left direction by approximately 15 nm to 30 nm.

6. The organic light emitting device according to claim 5, wherein a full width of half maximum (FWHM) of the PL spectrum of the first host is approximately 100 nm to 130 nm, and
wherein a FWHM of the second host is ½ or less of the FWHM of the first host.

7. The organic light emitting device according to claim 4, wherein an EL peak of the second emissive layer is on the right side of an electroluminescence (EL) peak of the first emissive layer.

8. The organic light emitting device according to claim 4, wherein a thickness ratio of the first and second emissive layers is approximately 1:0.5 to 1:2.

9. An organic light emitting display device comprising:
a substrate comprising a plurality of sub pixels;
thin film transistors disposed in the respective sub pixels; and
an organic light emitting device connected to the thin film transistor in at least one of the sub pixels,
wherein the organic light emitting device includes:
first and second electrodes facing each other; and
a light emitting portion comprising first and second emissive layers that contact each other in a thickness direction between the first and second electrodes,
wherein the first emissive layer comprises a first host and a first dopant, a photoluminescence (PL) spectrum of the first host having a peak in a first wavelength, and
wherein the second emissive layer comprises a second host and a second dopant, a PL spectrum of the second host having a peak in a second wavelength spaced apart from the first wavelength by 15 nm to 123 nm.

10. The organic light emitting display device of claim 9, wherein the first and second dopants are the same and have the same PL spectrum with a peak in a wavelength of approximately 610 nm to 630 nm.

11. An organic light emitting device comprising:
first and second electrodes facing each other; and
a light emitting portion comprising first and second emissive layers that contact each other in a thickness direction between the first and second electrodes,
wherein the first emissive layer comprises a first host of photoluminescence (PL) spectrum having a peak in a first wavelength,
wherein the second emissive layer comprises a second host of PL spectrum having a peak in a second wavelength spaced apart from the first wavelength by approximately 15 nm to 123 nm,
wherein the first and second emissive layers further comprise dopants of a PL spectrum having a peak in the same wavelength,
wherein PL spectrums of the first host and the second host have an overlapping region with the PL spectrum of the dopant, and
wherein an overlapping region between the PL spectrum of the first host and the PL spectrum of the dopant is greater than an overlapping region between the PL spectrum of the second host and the PL spectrum of the dopant.

* * * * *